United States Patent [19]

Guajardo et al.

[11] 4,403,157
[45] Sep. 6, 1983

[54] CONTROL CIRCUIT FOR LIGHT EMITTING DIODE

[75] Inventors: Ciro Guajardo, Harbor City; Dennis B. Chabala, Huntington Beach, both of Calif.

[73] Assignee: Teledyne Industries, Inc., Los Angeles, Calif.

[21] Appl. No.: 346,615

[22] Filed: Feb. 8, 1982

[51] Int. Cl.³ .................. H03F 3/45; H03F 3/345; H03L 5/00
[52] U.S. Cl. ............................. 307/297; 307/299 B; 307/311
[58] Field of Search .................... 307/297, 299 B, 311

[56] References Cited

U.S. PATENT DOCUMENTS

| 3,700,921 | 10/1972 | Gay | 307/299 B |
| 3,902,806 | 9/1975 | Bober | 307/297 |
| 3,911,268 | 10/1975 | Mori et al. | 307/297 |
| 3,922,570 | 11/1975 | Eguchi et al. | 307/297 |
| 4,160,934 | 7/1979 | Kirsch | 307/297 |
| 4,258,276 | 3/1981 | Beling | 307/311 |

Primary Examiner—John S. Heyman
Attorney, Agent, or Firm—Reagin & King

[57] ABSTRACT

A circuit for controlling one or more light emitting diodes is disclosed. The circuit is designed to supply current to the diodes from an input voltage source in response to a control signal. The circuit provides a predetermined level of current to the diodes which is substantially independent of the magnitude of the input voltage. The circuit also includes a switching function which operates to switch off the diode current when the control signal exceeds a first level of control voltage. When the control signal is reduced below a second level of control voltage, the diode current is switched to the predetermined level of current.

8 Claims, 1 Drawing Figure

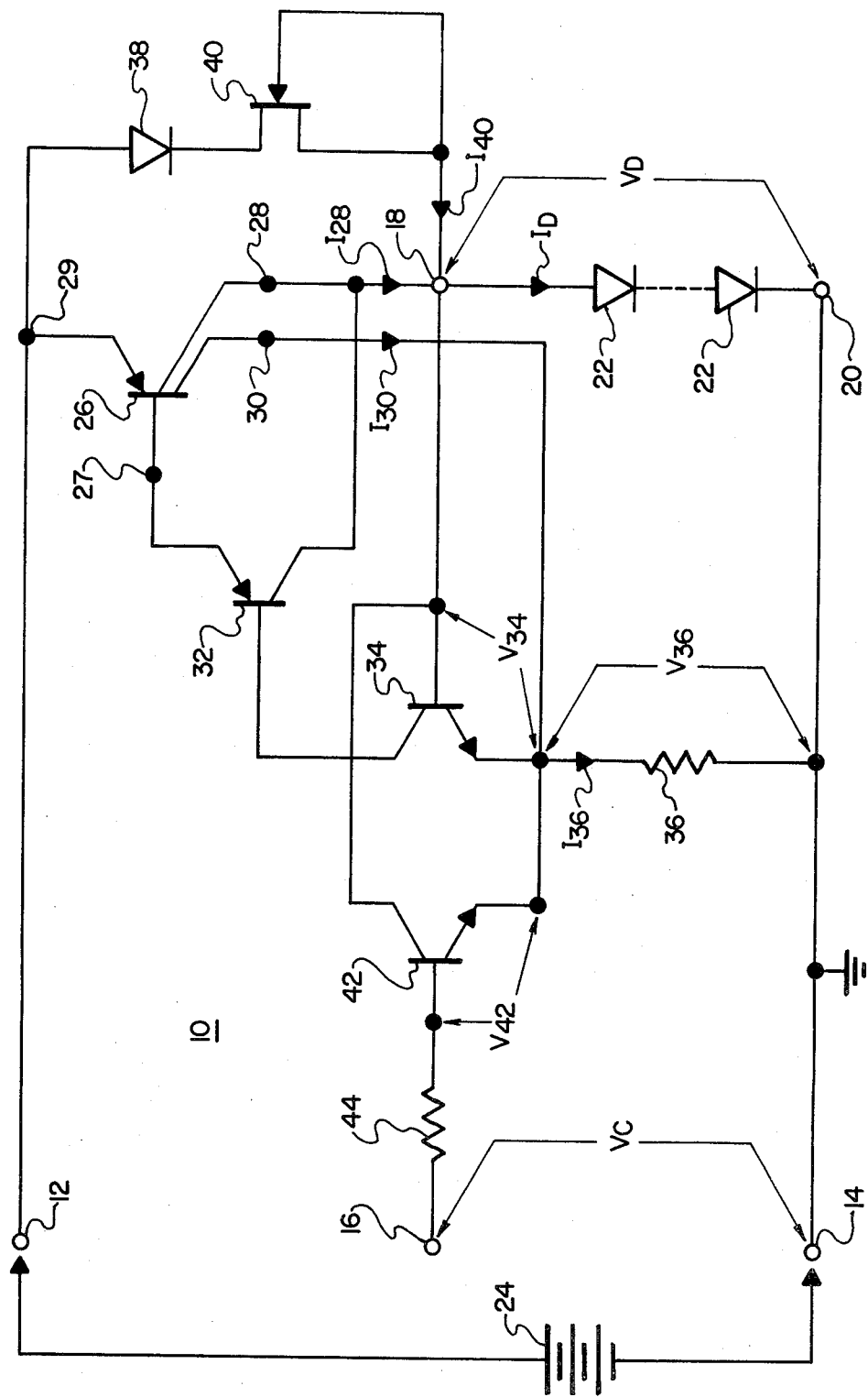

CONTROL CIRCUIT FOR LIGHT EMITTING DIODE

BACKGROUND OF THE INVENTION

This invention relates to control circuits and more particularly, to circuits for controlling light emitting diodes and the like.

One of the many uses for light emitting diodes (LEDs) is to provide a source of light to trigger a photosensitive semiconductor device into conduction. An example of such a use is described in copending U.S. patent application Ser. No. 164,224, filed June 30, 1980, entitled "IMPROVED ZERO VOLTAGE SWITCHING AC RELAY CIRCUIT," and assigned to the assignee of the present invention.

The above referenced application discloses a circuit including two series connected LEDs which are optically coupled, respectively, to two photosensitive silicon controlled rectifiers (SCRs). When the LEDs are energized by the application of an input signal, they generate light which causes the SCRs to conduct. The SCRs, in turn, control the application of power to a load.

For proper operation, this type of circuit and others like it usually require that the LEDs be operated at a current level ranging between specified levels of minimum and maximum current. Operation of the LEDs outside of the specified range may result in improper circuit operation or component failure. Generally, the level of current supplied to the LEDs is determined by the value of a fixed resistor connected in series between the LEDs and the input signal source.

Circuits of the type described above, usually designated as solid state relay circuits, find widespread use as interfaces between low level logic circuits and high power circuits in which the output signal from the logic circuit is used to energize the LEDs. However, many solid state relay circuits require that the LEDs be energized at a current level which exceeds the output current capability of some types of logic circuits. For example, complementary metal oxide semiconductor (CMOS) logic circuits are generally not capable of supplying more than one or two milliamperes of output current while many relay circuits require a minimum LED current of five milliamperes or more for proper operation. Accordingly, it is necessary to provide a separate buffer circuit between a CMOS logic circuit and the LEDs to provide the necessary drive current.

In some applications of solid state relay circuits it is desirable to energize the LEDs with an input signal which varies over a wide range of voltages. For example, it may be desirable to energize the LEDs from a voltage source ranging from as little as five to as much as thirty volts. However, many prior art circuits cannot be so operated because they employ a fixed resistor to establish the proper level of LED operating current for a predetermined input voltage; and, if operated with a different input voltage require a different resistor to establish the proper level of operating current.

Many prior art circuits lack the capability to ensure that the LED current is above a specified minimum level. This is so because the level of LED current in the prior art circuits is a function of both the value of the fixed resistor and the magnitude of the input voltage. Thus, for example, if the resistor is chosen to establish the minimum required LED current at an input voltage of five volts, the application of a lower input voltage will result in insufficient current flow to the LED.

Accordingly, it is an object of the present invention to provide a new and improved circuit for controlling a light emitting diode.

It is another object of the invention to control a light emitting diode over a wide range of input voltage.

It is still another object of the invention to control a light emitting diode in direct response to the output signal from a low power logic circuit such as a CMOS logic circuit.

It is yet another object of the invention to control a light emitting diode in a manner which ensures that the diode is operated at a predetermined current level.

SUMMARY OF THE INVENTION

The foregoing and other objects of the invention are accomplished by a control circuit connected to supply current to one or more LEDs from an input voltage source. The circuit includes circuitry designed to provide a predetermined level of current which is relatively independent of the magnitude of the input voltage source for use by LEDs. The predetermined level of current is a function of both the forward voltage drop of the LED and the magnitude of a resistor connected to the circuit. The magnitude of the resistor is chosen to set the desired level of LED current.

The circuit also includes switching means for controlling the application and removal of current to the LED in response to a control signal. The switching means is designed so that when the control signal voltage is greater than a first level of control voltage, the current flow to the LED is switched off. Further, when the control signal voltage is less than a second level of control voltage, the current to the LED is switched to the predetermined level of current. Both the first and second levels of control voltage are designed to correspond to the output signal levels provided by a low level logic circuit. The amount of current required from the control signal source is significantly less than one milliampere permitting the control circuit to be directly controlled from a low power logic circuit (such as CMOS logic).

Other objects, features, and advantages of the invention will become apparent from a reading of the specification in conjunction with the drawing.

BRIEF DESCRIPTION OF THE DRAWING

The sole FIGURE is a schematic diagram of a control circuit constructed in accordance with the present invention.

DESCRIPTION OF THE PREFERRED EMBODIMENT

Referring to the FIGURE, there is shown a schematic diagram of a control circuit 10 constructed in accordance with the present invention. The circuit 10 is designed to be constructed as an integrated circuit and includes positive and negative input terminals 12 and 14, respectively, control terminal 16, and positive and negative output terminals 18 and 20, respectively. For purposes of discussion, the terminal 14 is designated as ground. One or more light emitting diodes (LEDs) 22 which are to be controlled by the circuit 10 are connected in series between the output terminals 18 and 20. The positive and negative terminals of an input voltage source 24 are connected, respectively, to the input terminals 12 and 14.

A first PNP transistor 26 is provided having a base terminal 27, an emitter terminal 29, and first and second collector terminals 28 and 30, respectively. The collector terminals 28 and 30 are each connected to separate collectors within the structure of the transistor 26. It is well known to those skilled in the art that transistors may be fabricated having multiple collectors. It is also known that the current flowing in the first collector circuit is related to the current flowing in the second collector circuit by the ratio of the physical areas of the respective collectors. In a preferred embodiment of the invention, the area of the collector connected to the terminal 28 is designed to be greater than the area of the collector connected to the terminal 30 by a factor designated K. Accordingly, current $I_{28}$ flowing from the collector terminal 28 is K times greater than current $I_{30}$ flowing from the collector terminal 30.

The emitter terminal 29 of the transistor 26 is connected to the positive input terminal 12 of the circuit 10. The collector terminal 28 is connected to the output terminal 18 which is connected through the LEDs 22 to the output terminal 20 which is common with the input terminal 14. The base terminal 27 of the transistor 26 is connected to the emitter terminal of a second PNP transistor 32. The collector terminal of the transistor 32 is in turn connected to the collector terminal 28 of the transistor 26.

The collector and base terminals of a first NPN transistor 34 are connected, respectively, to the base and collector terminals of the transistor 32. The emitter terminal of the transistor 34 is in turn connected both to the collector terminal 30 of the transistor 26 and to one end of a resistor 36. The other end of the resistor 36 is connected to the output terminal 20.

A diode 38 is provided, the anode terminal of which is connected to the emitter terminal 29 of the transistor 26. The cathode terminal of the diode 38 is connected to the drain terminal of an N-channel junction field effect transistor (JFET) 40. The gate and source terminals of the JFET 40 are connected to each other and to the output terminal 18 of the circuit 10.

The operation of the circuit 10 described thus far is as follows. When the input voltage source 24 is connected to the input terminals 12 and 14, the JFET 40, when connected as shown, is normally conducting and provides a small amount of bias current $I_{40}$ to the base terminal of the transistor 34 from the source 24. As is well known to those skilled in the art, the JFET 40 connected as shown in the FIGURE acts as a current limiting element so that the magnitude of the current $I_{40}$ is relatively independent of the magnitude of the voltage source 24. The parameters of the JFET 40 are chosen so that the magnitude of the current $I_{40}$ is several orders of magnitude less than the currents $I_{28}$ and $I_{30}$ and yet is sufficient to start the circuit operation by biasing the transistor 34 into conduction. In a preferred embodiment of the invention, the parameters of the JFET 40 are chosen so that the current $I_{40}$ is about fifty microamperes. The diode 38 acts to prevent reverse current flow through the JFET 40 in the event of a reversal of the polarity of the voltage source 24.

When the transistor 34 is biased into conduction, it provides base bias current to the transistor 32 to cause it to conduct. When the transistor 32 conducts, it provides base bias current to cause the transistor 26 to conduct. The transistors 32 and 26 are connected to form a two-stage Darlington amplifier. In this Darlington amplifier, the current flowing from the base terminal of the transistor 32 is multiplied both by the current gain of the transistor 32 and by the current gain of the transistor 26. In a preferred embodiment of the invention, the transistor 32 is configured to have a current gain of about fifty and the transistor 26 is configured to have a current gain of about fifteen. Accordingly, the currents flowing from the collector terminals 28 and 30 of the transistor 26 are several orders of magnitude greater than the bias current flowing from the base terminal of the transistor 32.

The transistor 34 in conjunction with the resistor 36 forms an emitter follower configuration which serves to regulate the flow of current $I_D$ through the LEDs 22 in the following manner. The voltage appearing between the base terminal of the transistor 34 and ground is equal to the sum of the forward voltage drop of the LEDs 22. The sum of these voltage drops is designated $V_D$ in the FIGURE. The voltage appearing between the emitter terminal of the transistor 34 and ground is the voltage $V_{36}$ appearing across the resistor 36. Accordingly, the following relationship is established where $V_{34}$ is the base-emitter voltage drop of the transistor 34:

$$V_D - V_{36} = V_{34} \qquad (A)$$

The current $I_{36}$ flowing through the resistor 36 is equal to the sum of the current $I_{30}$ and the current flowing through the transistor 34. The current flowing through the transistor 34 is substantially equal to the current flowing from the base terminal of the transistor 32. As determined above, this base current is several orders of magnitude less than the magnitude of the current $I_{30}$. Accordingly, the current $I_{36}$ is substantially equal to the current $I_{30}$, and the following relationship is established, where R represents the resistance value of the resistor 36:

$$V_{36} \approx R \cdot I_{30} \qquad (B)$$

The current $I_D$ flowing through the LEDs 22 is equal to the sum of the currents $I_{28}$ and $I_{40}$, less the current flowing into the base terminal of the transistor 34. The transistor 34 base current is equal to the transistor 32 base current divided by the current gain of the transistor 34 (approximately one hundred in the preferred embodiment). Thus, the current flowing into the base terminal of the transistor 34 is several orders of magnitude less than the current $I_{28}$. Since the current $I_{40}$ is also several orders of magnitude less than the current $I_{28}$, the current $I_D$ is substantially equal to the current $I_{28}$ and the following relationship is established:

$$I_D \approx I_{28} \qquad (C)$$

In the previous discussion of the transistor 26, it was indicated that the current $I_{28}$ is related to the current $I_{30}$ by the factor K, where K represents the ratio of the respective areas of the two collectors of the transistor 26. Accordingly, the following relationship is established:

$$I_{28} = K \cdot I_{30} \qquad (D)$$

Rearranging and combining the terms of the equations A, B, C, and D above yields the following relationship for the current $I_D$ flowing through the LEDs 22:

$$I_D \approx (K/R) \cdot (V_D - V_{34}) \qquad (E)$$

From Equation (E) it can be seen that the current $I_D$ flowing through the LEDs 22 is independent of the magnitude of the input voltage from the source 24. Thus, the circuit 10 described thus far acts to provide a constant level of current $I_D$ to the LEDs 22 which is independent of the magnitude of the voltage from the source 24.

By way of example, in a preferred embodiment of the invention configured to provide current to two series connected LEDs 22, the value K is chosen to be twelve, and the value R of the resistor 36 is chosen as nineteen hundred ohms. The circuit 10 is fabricated of silicon which establishes the base-emitter voltage $V_{34}$ of the transistor 34 at about six tenths of a volt. Each LED 22 is fabricated of gallium-arsenide and exhibits a forward voltage drop of about one and one quarter volts. Substituting these values in equation (E), it can be seen that the current $I_D$ supplied to the LEDs 22 is about twelve milliamperes. It has been found that the circuit 10 will maintain the current $I_D$ constant to within a few percent over a range of input voltage from five to thirty volts.

The circuit 10 also includes switching means for controlling the application and removal of the current $I_D$ from the LEDs 22 in response to a control signal. Referring to the FIGURE, a second NPN transistor 42 is provided, the collector and emitter terminals of which are connected, respectively, to the base and emitter terminals of the transistor 34. The base terminal of the transistor 42 is connected through a resistor 44 to the control terminal 16.

The operation of the above described portion of the circuit is as follows. The transistor 42 is controlled by a positive control voltage (designated $V_C$) applied to the terminals 16 and 14 of the circuit 10. In the absence of the control voltage VC, the transistor 42 is non-conducting and the circuit 10 operates as described above to provide the predetermined level of current $I_D$ to the LEDs 22.

When the transistor 42 is biased into conduction by the application of the control voltage VC, the transistor 42 acts to clamp the base-emitter junction of the transistor 34, causing it to switch to a non-conducting state. This in turn stops the flow of base current to the transistors 32 and 26. Accordingly, the transistor 26 switches to the non-conducting state, reducing the currents $I_{28}$ and $I_{30}$ (and hence the currents $I_D$ and $I_{36}$) to zero. The only current remaining flowing through the LEDs 22 is the current $I_{40}$ supplied by the JFET 40. As indicated above, the current $I_{40}$ is of a small magnitude and is insufficient to cause the LEDs 22 to emit light. Thus, for all practical purposes the current $I_D$ is zero and the LEDs 22 are switched off.

The magnitude of the control voltage $V_C(on)$ necessary to bias the transistor 42 into conduction is approximately equal to the sum of the base-emitter voltage drop $V_{42}$ of the transistor 42 (about six tenths of a volt) and the voltage $V_{36}$ appearing across the resistor 36:

$$V_C(on) = V_{42} + V_{36} \tag{F}$$

The voltage $V_{36}$ may be determined from the equation (A) above as equal to the difference between the voltage $V_D$ and the base-emitter voltage drop $V_{34}$ of the transistor 34. Since both the transistors 34 and 42 are formed of silicon, their respective base-emitter voltage drops ($V_{34}$ and $V_{42}$) are substantially equal to each other. Thus, it may be seen that the magnitude of the control voltage $V_C$ necessary to bias the transistor 42 into conduction is substantially equal to the voltage $V_D$. The voltage $V_D$ is equal to the sum of the voltage drops of each of the LEDs 22 (approximately one and one quarter volts each). Therefore, the control voltage $V_C$ must reach a value of about two and one half volts before the transistor 42 will begin conducting.

As explained above, when the transistor 42 begins to conduct, the transistor 26 begins to turn off which reduces the currents $I_{28}$ and $I_{30}$. Accordingly, the voltage $V_D$ is reduced, as is the voltage $V_{36}$. A reduction in the voltage $V_{36}$ acts to increase the amount of bias current flowing through the resistor 44 into the base terminal of the transistor 42. This increased flow of bias current causes the transistor 42 to be biased further into conduction. The circuit 10 thus acts in a regenerative manner in response to the control voltage $V_C$ to cause the current $I_D$ to rapidly switch from the predetermined current level to zero.

With the circuit 10 thus switched off, the voltage $V_{36}$ is reduced to a value near zero. From the equation (F) above, it can be seen that under this condition the transistor 42 will remain conducting until the control voltage $V_C$ is reduced to approximately the base-emitter voltage drop $V_{42}$ of the transistor 42 (about six tenths of a volt.) At this voltage level, the transistor 42 begins switching to the non-conducting state which causes the voltage $V_{36}$ to increase. An increase in the voltage $V_{36}$ in turn causes a decrease in the amount of bias current flowing into the base terminal of the transistor 42, which causes it to switch further into the non-conducting state. Thus, the circuit 10 also acts in a regenerative manner in response to the control voltage $V_C$ to cause the current $I_D$ to rapidly switch from zero to the constant current level determined by the equation (E) above (twelve milliamperes for the preferred embodiment).

From the above description, it can be seen that the circuit 10 is designed to ensure that the LEDs 22 are either operated at a predetermined level of current or are switched off. Further, the regenerative action of the circuit 10 provides hysteresis whereby a first level of control voltage $V_C$ is necessary to switch off the circuit 10 and a second level of control voltage $V_C$ is necessary to switch on the circuit 10. It is well known to those skilled in the art that hysteresis acts to improve the immunity of the circuit to noise appearing on the control signal $V_C$.

Another feature of the circuit 10 is that only a small amount of current (typically less than one hundred microamperes) is required to bias the transistor 42 into conduction. Accordingly, the value of the resistor 44 may be made large (typically ten kilohms or more) without adversely affecting the circuit operation. This has the added benefit of permitting the control signal $V_C$ to increase to a relatively high voltage (typically thirty volts or more) without damaging the circuit 10. Further, the levels of control voltage $V_C$ necessary to turn the circuit 10 on and off (two and one half volts and six tenths of a volt, respectively) are equivalent to the voltage levels obtained from a typical logic circuit. Accordingly, the control voltage $V_C$ may be obtained directly from the output terminal of a low power logic circuit such as a CMOS logic circuit.

In a preferred embodiment, the components 26, 32, 34, 38, 40, and 42 are designed to be fabricated as a monolithic integrated circuit. The resistors 36 and 44 may also be included as part of the integrated circuit or may be provided separately to permit their values to be easily changed. It should also be noted that the circuit 10 is capable of controlling one or more LEDs 22 in a manner analogous to that described above for the two LEDs 22.

While the invention is disclosed and a particular embodiment is described in detail, it is not intended that the invention be limited solely to this embodiment. Many modifications will occur to those skilled in the art which are within the spirit and scope of the invention. Thus, although aspects and advantages of the preferred embodiment have been shown and described herein, it is intended that the invention be limited in scope only by the appended claims.

What is claimed is:

1. A control circuit comprising:
   a first transistor having base, emitter, and first and second collector terminals;
   second, third, and fourth transistors each having base, emitter, and collector terminals;
   a resistor;
   means for connecting the emitter terminal of the first transistor to a first input terminal;
   means for connecting the first collector terminal of the first transistor to a first output terminal;
   means for connecting the base terminal of the first transistor to the emitter terminal of the second transistor;
   means for connecting the base terminal of the third transistor to the first output terminal;
   means for connecting the collector terminal of the second transistor to the first collector terminal of the first transistor;
   means for connecting the base terminal of the second transistor to the collector terminal of the third transistor;
   means for connecting the second collector terminal of the first transistor to the emitter terminal of the third transistor;
   means for connecting the resistor between the emitter terminal of the third transistor and a second input terminal;
   means for connecting the collector and emitter terminals of the fourth transistor to the base and emitter terminals, respectively, of the third transistor;
   means for connecting the base terminal of the fourth transistor to a control terminal; and
   means for biasing the third transistor into conduction.

2. The control circuit of claim 1 further including means for connecting a light emitting diode between the first output terminal and the second input terminal.

3. The control circuit of claim 1 further including means for connecting a plurality of series-connected light emitting diodes between the first output terminal and the second input terminal.

4. The control circuit of claim 1 in which the means for biasing the third transistor into conduction includes a field effect transistor having drain, source, and gate terminals; means for connecting the gate terminal to the source terminal; and means for connecting the drain and source terminals to the first input terminal and the first output terminal, respectively.

5. The control circuit of claim 1 in which the means for connecting the base terminal of the fourth transistor to the control terminal includes means for connecting a second resistor between the base terminal of the fourth transistor and the control terminal.

6. The control circuit of claim 1 further including means for applying an input voltage between the first and second input terminals.

7. The control circuit of claim 1 further including means for applying a control signal between the control terminal and the second input terminal.

8. A control circuit comprising:
   a first transistor having a base and emitter terminal, and first and second collector terminals for providing first and second currents, respectively, where the first current is a constant multiple of the second current;
   a resistor;
   second and third transistors, each having base, emitter, and collector terminals;
   means for connecting one terminal of a light emitting diode to the first collector terminal of the first transistor;
   means for connecting a power source between the emitter terminal of the first transistor and the other terminal of the light emitting diode;
   means for connecting one terminal of the resistor to the emitter terminal of the second transistor;
   means for connecting the other terminal of the resistor to the other terminal of the light emitting diode;
   means for connecting the second collector terminal of the first transistor to the emitter terminal of the second transistor;
   means for connecting the base terminal of the second transistor to the first collector terminal of the first transistor;
   means for connecting the collector terminal of the second transistor to the base terminal of the first transistor, whereby the second transistor provides base bias current to the first transistor in a manner which establishes a predetermined current flow through the light emitting diode substantially equal to the difference between the voltage drop of the light emitting diode and the base-emitter voltage drop of the second transistor, multiplied by the constant multiple, and divided by the value of the resistor; and
   means for connecting the collector and emitter terminals of the third transistor to the base and emitter terminals, respectively, of the second transistor, whereby when the third transistor is biased into conduction by the application of a control voltage to its base terminal, the current flowing through the line emitting diode is switched from the predetermined level of current to substantially zero current.

* * * * *